US009270084B2

(12) United States Patent
Zhou et al.

(10) Patent No.: US 9,270,084 B2
(45) Date of Patent: Feb. 23, 2016

(54) CERIUM DOPED MAGNESIUM BARIUM TUNGSTATE LUMINESCENT THIN FILM, MANUFACTURING METHOD AND APPLICATION THEREOF

(75) Inventors: Mingjie Zhou, Shenzhen (CN); Ping Wang, Shenzhen (CN); Jixing Chen, Shenzhen (CN); Hui Huang, Shenzhen (CN)

(73) Assignee: Ocean's King Lighting Science & Technology Co., Ltd. (CN)

( * ) Notice: Subject to any disclaimer, the term of this patent is extended or adjusted under 35 U.S.C. 154(b) by 158 days.

(21) Appl. No.: 14/130,228

(22) PCT Filed: Jun. 28, 2011

(86) PCT No.: PCT/CN2011/076467
§ 371 (c)(1),
(2), (4) Date: Jan. 30, 2014

(87) PCT Pub. No.: WO2013/000117
PCT Pub. Date: Jan. 3, 2013

(65) Prior Publication Data
US 2014/0145114 A1    May 29, 2014

(51) Int. Cl.
*C09K 11/77* (2006.01)
*C23C 14/34* (2006.01)
(Continued)

(52) U.S. Cl.
CPC ........... *H01S 5/3018* (2013.01); *C09K 11/7718* (2013.01); *C09K 11/7768* (2013.01); *C23C 14/081* (2013.01); *C23C 14/35* (2013.01); *H05B 33/14* (2013.01)

(58) Field of Classification Search
CPC ............ C09K 11/682; C09K 11/7718; C09K 11/7768; C09K 11/68; C09K 11/7708; C09K 11/7722; C09K 11/776; C23C 14/081; C23C 14/35; C23C 14/082; C23C 14/3407; C23C 14/3414; C23C 14/351; C23C 14/165; C23C 14/228; C23C 14/5806; H01J 29/385; H01J 2235/081; H01J 37/3405; H01J 37/3408; H01J 37/3414; H01J 37/3426; H01J 37/3429; H01J 37/3491; H01S 5/3018; C03C 17/36
USPC .......... 252/301.5; 204/192.1, 298.01, 298.16, 204/214 VT, 192.26, 298.02, 98.16, 298.13; 313/527, 503, 502; 250/214 VT
See application file for complete search history.

(56) References Cited

U.S. PATENT DOCUMENTS 3,257,327 A    6/1966   Kurt
3,338,841 A *  8/1967   Brixner ................ 252/301.4 R
(Continued)

FOREIGN PATENT DOCUMENTS

CN         1865537 A       11/2006
CN       101368258          2/2009
(Continued)

OTHER PUBLICATIONS

Machine translation of CN 102791052 A, printed Jul. 30, 2015.*
(Continued)

*Primary Examiner* — Matthew E Hoban
*Assistant Examiner* — Lynne Edmondson
(74) *Attorney, Agent, or Firm* — Fox Rothschild LLP; Jianming J. Hao

(57) ABSTRACT

Cerium doped magnesium barium tungstate luminescent thin film, manufacturing method and application thereof are provided, said method for manufacturing cerium doped magnesium barium tungstate luminescent thin film comprises the following steps: mixing MgO, BaO, $WO_3$ and $Ce_2O_3$, sintering for forming sputtering target, forming the precursor of cerium doped magnesium barium tungstate luminescent thin film by magnetron sputtering, annealing the precursor of cerium doped magnesium barium tungstate luminescent thin film, and then forming cerium doped magnesium barium tungstate luminescent thin film. Said cerium doped magnesium barium tungstate luminescent thin film exhibits high luminescence efficiency and high light emitting peaks in red and blue regions. Said method presents the advantages of simplified operation, less cost, and suitable for industrial preparation.

10 Claims, 2 Drawing Sheets

(51) Int. Cl.
   *H01J 37/34*   (2006.01)
   *H01S 5/30*    (2006.01)
   *C23C 14/08*   (2006.01)
   *C23C 14/35*   (2006.01)
   *H05B 33/14*   (2006.01)

(56) References Cited

U.S. PATENT DOCUMENTS

2003/0052000 A1* 3/2003 Segal et al. ............. 204/298.13
2005/0214573 A1  9/2005 Den et al.
2010/0151179 A1* 6/2010 Nishihara ............... C23C 14/08
                                                  428/64.5
2010/0244066 A1  9/2010 Chiu et al.
2011/0168994 A1* 7/2011 Kawashima et al. ........... 257/43

FOREIGN PATENT DOCUMENTS

| CN | 102791052 A | * | 11/2012 |
|---|---|---|---|
| JP | 58-021477 A | | 2/1983 |
| JP | 01-263188 A | | 10/1989 |
| JP | 05-320639 A | | 12/1993 |
| JP | 6-251872 | | 9/1994 |
| JP | 08-092553 A | | 4/1996 |
| JP | 2003-138257 A | | 5/2003 |
| JP | 2003138257 | | 5/2003 |
| JP | 2005220299 A | | 8/2005 |
| JP | 2006004658 A | | 1/2006 |
| JP | 2006-232601 | | 9/2006 |
| WO | 2006/111568 A2 | | 10/2006 |

OTHER PUBLICATIONS

Office Action dated Jul. 28, 2014, issued in Chinese Application No. 201180070930.9.

* cited by examiner

CERIUM DOPED MAGNESIUM BARIUM TUNGSTATE LUMINESCENT THIN FILM, MANUFACTURING METHOD AND APPLICATION THEREOF

CROSS REFERENCE TO RELATED APPLICATIONS

The present application is the U.S. National Phase of International patent application Ser. No. PCTICN2011/076467, filed Jun. 28, 2011, the contents of which are hereby incoiporated by reference in its entirety.

TECHNICAL FIELD

The present invention relates to the technical field of semiconductor optoelectronic materials, in particular to a cerium doped magnesium barium tungstate luminescent thin film, and manufacturing method and application thereof.

BACKGROUND ART

Scheelite structured $AWO_4$ (A=Ca, Sr, Ba) is one important type of laser materials. It presents as a tetragonal structure at room temperature and emits blue light under ultraviolet ray excitation. Barium tungstate maintains its tetragonal structure from room temperature to its melting point (1820 K), and possesses good structural stability. Due to these excellent properties, barium tungstate has an attractive applicable prospect in the field of light emitting and display technology, laser and optoelectronics technology and detection technology. At present, barium tungstate has been applied to phosphors, but less involved in the field of cerium-doped magnesium barium tungstate luminescent thin film, and the resulting film exhibits low luminescence efficiency; further, complicated preparation process is often involved.

DISCLOSURE OF THE INVENTION

Technical Problems

In view of this, the embodiment of the present invention provides a cerium-doped magnesium barium tungstate luminescent thin film, and manufacturing method and application thereof to solve the technical problems in the prior art, like complicated process for manufacturing a cerium-doped magnesium barium tungstate luminescent thin film, high cost, low luminescence efficiency of a cerium-doped magnesium barium tungstate luminescent thin film.

Technical Solution

The embodiment of the present invention is achieved in the following way:

providing a cerium-doped magnesium barium tungstate luminescent thin film, having the molecular formula of $Mg_xBa_{1-x}W_2O_8:YCe^{3+}$ where x is from range of 0.13 to 0.96, Y is from range of 0.0002 to 0.0124;

and providing a method for manufacturing a cerium-doped magnesium barium tungstate luminescent thin film, comprising the following steps:

mixing magnesium oxide, barium oxide, tungsten oxide and cerium oxide; sintering for forming sputtering target, wherein the content in mass percentage of said magnesium oxide is 0.1% to 15%, the content in mass percentage of said barium oxide is 0.1% to 40%, the content in mass percentage of said cerium oxide is 0.01% to 0.8%, the rest is tungsten trioxide;

forming the precursor of cerium doped magnesium barium tungstate luminescent thin film by subjecting the sputtering target to magnetron sputtering;

annealing the precursor of cerium doped magnesium barium tungstate luminescent thin film to form the cerium doped magnesium barium tungstate luminescent thin film.

The embodiment of the present invention further provides the use of the above-mentioned cerium doped magnesium barium tungstate luminescent thin film in electroluminescent devices.

The Beneficial Effects

The combined use of cerium and magnesium barium tungstate in the cerium doped magnesium barium tungstate luminescent thin film of the embodiment of the present invention results in a film that exhibits higher luminescence efficiency, and exhibits relatively high. emission peaks in both the red and blue regions, for example emission peaks at 470 nm and 670 nm; said method of manufacturing the cerium doped magnesium barium tungstate luminescent thin film of the embodiment of the present invention presents the advantages of simplified operation, low cost, and suitable for industrial preparation.

DETAILED DESCRIPTION OF THE EMBODIMENTS

The above and other objects, features, and advantages of the present invention will become more apparent from the following detailed description when taken in conjunction with the accompanying drawings and embodiments. It should be understood that the specific embodiments described herein are merely for illustrative purpose.. rather than limiting the present invention.

The embodiment of the present invention provides a cerium doped magnesium barium. tungstate luminescent thin film.

having the molecular formula of $Mg_xBa_{1-x}W_2O_8:YCe^{3+}$, where x is from range of 0.13 to 0.96, preferably 0.43, Y is from range of 0.0002 to 0.0124, preferably 0.0023.

The cerium doped magnesium barium tungstate luminescent thin film of the present invention takes magnesium barium tungstate as the luminous host material of the luminescent thin film, and takes elemental cerium as the luminescence center, which results in relatively high luminescence efficiency in the cerium doped magnesium barium tungstate luminescent thin film of the embodiment according to the present invention by making use of the combined use of magnesium barium tungstate and cerium; and renders the ability of adjusting the luminescent intensity of the cerium doped magnesium barium tungstate luminescent thin film by varying the content of magnesium and barium in the magnesium barium tungstate that acts as the luminous host material.

Figure 1:
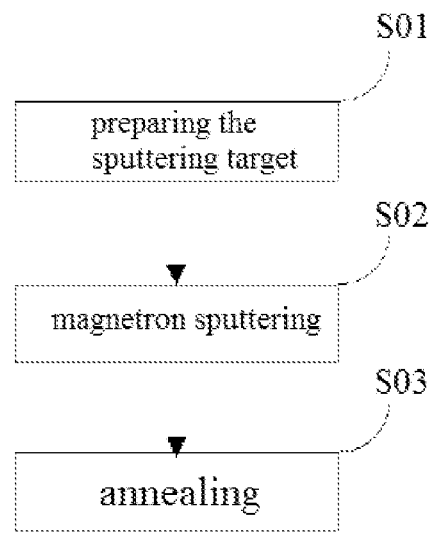
FIG. 1 shows the flowchart of the manufacturing method of the cerium doped magnesium barium tungstate luminescent thin film of the embodiment according to the present invention.
Figure 3:
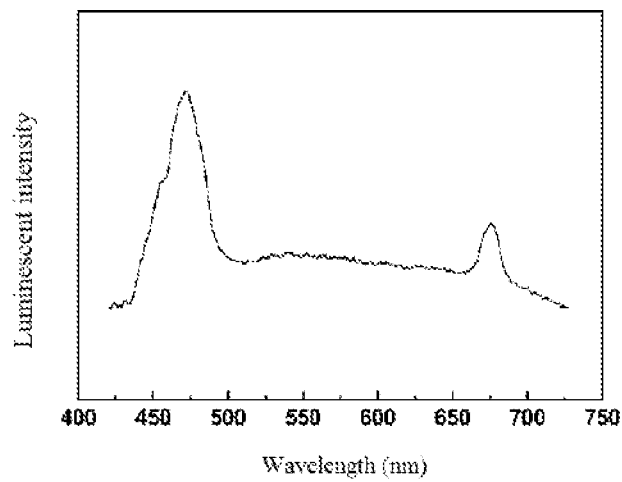
FIG. 3 shows the EL spectra of the cerium doped magnesium barium tungstate luminescent thin film obtained from Example according to the present invention.
Figure 4:
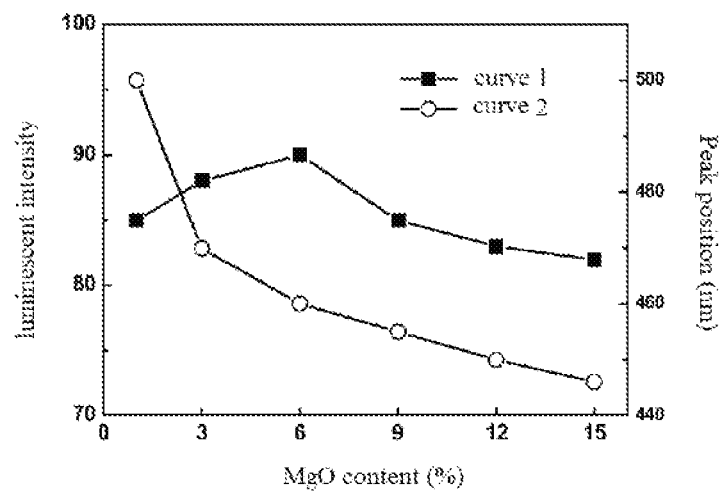
FIG. 4 shows the plot that illustrates the correlation of the luminescent intensity and the position of the emission peaks of the cerium doped magnesium barium tungstate luminescent thin film with the content of magnesium oxide.

With reference to FIG. 3, FIG. 3 shows the EL spectra of the cerium doped magnesium barium tungstate luminescent thin film obtained from Example according to the present invention. As shown in FIG. 1, the cerium doped magnesium barium tungstate luminescent thin film of the embodiment of the present invention shows emission peaks at 470 nm and 670 nm. With reference to FIG. 4, FIG. 4 shows the plot that illustrates changes of the luminescent intensity and the position of the emission peaks of the cerium doped magnesium barium tungstate luminescent thin film of the embodiment of the present invention by varying the content of magnesium oxide. Curve 1 shows changes of the luminescent intensity of film curve 2 shows changes of the position of the emission peaks of film. As shown in use 4, the luminescent intensity of the cerium-doped barium magnesium tungstate luminescent film firstly increases and then decreases as the content of magnesium oxide increases. As the content in mass percentage of the magnesium oxide in the manufacturing method is about 6%, the relative luminescent intensity shows the strongest with the increase of the content of magnesium oxide, the wavelength of the emission peaks of the cerium-doped magnesium barium tungstate luminescent film becomes shorter.

See FIG. 1, a flowchart of the manufacturing method of the cerium doped magnesium barium tungstate luminescent thin film of the embodiment according to the present invention is shown, said method comprises the steps of:

step S01, manufacturing of the sputtering target mixing magnesium oxide, barium oxide, tungsten oxide and cerium oxide; sintering for forming sputtering target, wherein the content in mass percentage of said magnesium oxide is 0.1% to 15%, the content in mass percentage of said barium oxide is 0.1% to 40%, the content in mass percentage of said cerium oxide is 0.01% to 0.8%, the rest is tungsten trioxide;

step S02, magnetron sputtering forming the precursor of cerium doped magnesium barium tungstate luminescent thin film by subjecting the sputtering target to magnetron sputtering;

step S03, annealing annealing the precursor of cerium doped magnesium barium tungstate luminescent thin film to form the cerium doped magnesium barium tungstate luminescent thin film.

Specifically, in step S01, magnesium oxide (MgO), barium oxide (BaO), tungsten oxide (WO) and cerium oxide ($Ce_2O_3$) are powers having a purity of 99.99% or above. The content of magnesium oxide in mass percentage is 0.1% to 15%, preferably 2% to 10%, for example, 6%; the content of barium oxide in mass percentage is 0.1% to 40%, preferably 0.2% to 30%, for example, 30% the content of cerium oxide in mass percentage is 0.01% to 0.8%, preferably 0.02% to 0.6%, for example, 0.15%.

In step S01, magnesium oxide, barium oxide, tungsten oxide and cerium oxide are mixed homogenously and then sintered at a temperature of 900° C. to 1300° C. to form a sputtering target of Φ50×2min; preferably, said sintering temperature is 1250° C.

Specifically, in step S02, the ITO substrate and the sputtering target are loaded into the chamber of a coating device, which the chamber is evacuated by means of a mechanical pump or a molecular pump such that a vacuum level of $1.0 \times 10^{-3}$ Pa to $1.0 \times 10^{-3}$ Pa, preferably $5.0 \times 10^{-4}$ Pa, is reached; sputtering is conducted under the following conditions: a distance of 50 to 100 mm from the substrate to the target, a substrate temperature of 250° C. to 750° C., employing a mixed gas of hydrogen and an inert gas as the operating gas, a gas flow rate of 15 to 30 sccm, a pressure of 0.2 to 4.5 Pa, to give a precursor of cerium doped magnesium barium tungstate luminescent thin film.

In step S02, limitations are not made there to said inert gas, for example, nitrogen, helium, argon, neon may be used; in said mixed gas of hydrogen and an inert gas, the content in volume percentage of hydrogen in said mixed gas is 1 to 15%, preferably, 10%; wherein, the distance between the substrate and the target is 70 mm, said substrate temperature is preferably 600° C., said gas flow rate is preferably 25 sccm, said pressure is preferably 2.0 Pa.

Specifically, in step S03, the precursor of cerium doped magnesium barium tungstate luminescent thin film is subjected to annealing in a vacuum furnace at a pressure of 0.01 Pa for 1 to 3 h, preferably 2 h, where the annealing temperature is 500° C. to 800° C., preferably 700° C., to give a cerium doped magnesium barium tungstate luminescent thin film.

The method of manufacturing the cerium doped magnesium barium tungstate luminescent thin film of the embodiment of the present invention by mixing magnesium oxide, barium oxide, tungsten oxide and cerium oxide, sintering for forming sputtering target, followed by sputtering for forming film provides the cerium doped magnesium barium tungstate luminescent thin film. Said cerium doped magnesium barium tungstate luminescent thin film exhibits relative high luminescence efficiency; said method of manufacturing the cerium doped magnesium barium tungstate luminescent thin film of the embodiment of the present invention presents the advantages of simplified operation, less cost, and suitable for industrial preparation.

Figure 5:
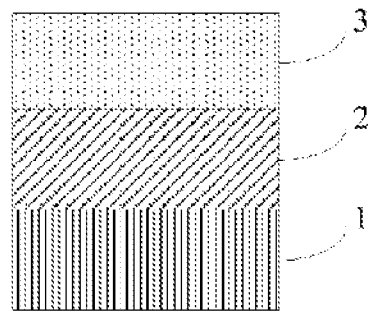
FIG. 5 shows schematically the structure of an electroluminescent device which employs the cerium doped magnesium barium tungstate luminescent thin film of the embodiment according to the present invention.

The embodiment Of the present invention further provides the Use of said cerium doped magnesium barium tungstate luminescent thin film in electroluminescent devices. With reference to FIG. 5, FIG. 5 shows schematically the structure of an electroluminescent device which employs the cerium doped magnesium barium tungstate luminescent thin film of the embodiment according to the present invention, which comprises anode 1, emission layer 2 and cathode 3. The material for said anode 1 is ITO coated glass, the material for said emission layer 2 is the cerium doped magnesium barium tungstate luminescent thin film of the embodiment according to the present invention and the material for said cathode 3 is silver.

Detailed description to said cerium doped magnesium barium tungstate luminescent thin film will now be given with reference to the exemplary embodiments:

EXAMPLE 1

Magnesium oxide, barium oxide, tungsten oxide and cerium oxide are mixed homogenously wherein the content in mass percentage of MgO is 6%, the content in mass percentage of BaO is 30%, the content in mass percentage of $Ce_2O_3$ is 0.15%, the rest is $WO_3$ (in mass percentage);

The mixture is sintered at a temperature of 1250° C. to form a ceramic sputtering target of Φ50×2 mm;

The target is loaded into a vacuum chamber, and the ITO coated glass substrate is then subjected to ultrasonic washing with a sequential use of acetone, anhydrous ethanol and deionized water, which is then subjected to oxygen plasma treatment, followed by placing it into the vacuum chamber. The distance between the target and the substrate is set to 75 mm. The chamber is evacuated by means of a mechanical pump and molecular pump such that a vacuum. level $5.0\times10^4$ Pa is reached, to which the vacuum chamber is purged with a mixed gas of argon and hydrogen as the operating gas, where the hydrogen content is 10% (in volume percentage), the gas flow rate is 25 sccm, the pressure is adjusted to 2.0 Pa, the substrate temperature is 600° C., a precursor of cerium doped magnesium barium tungstate luminescent thin film is formed by sputtering;

the precursor of cerium doped magnesium barium tungstate luminescent thin film is subjected to annealing in a vacuum furnace at 0.01 Pa under a temperature of 700° C. for 2 h to form the cerium doped magnesium barium tungstate luminescent thin film.

The thus obtained cerium doped magnesium barium tungstate luminescent thin film has a molecular formula of $Mg_{0.43}Ba_{0.57}W_2O_8$:0.0023 $Ce^{3+}$;

Onto the cerium doped magnesium barium tungstate luminescent thin turn is then deposited a layer of Ag as a cathode, to give an electroluminescent device comprising the cerium doped magnesium barium tungstate luminescent thin film of the embodiment of the present invention.

Figure 2:
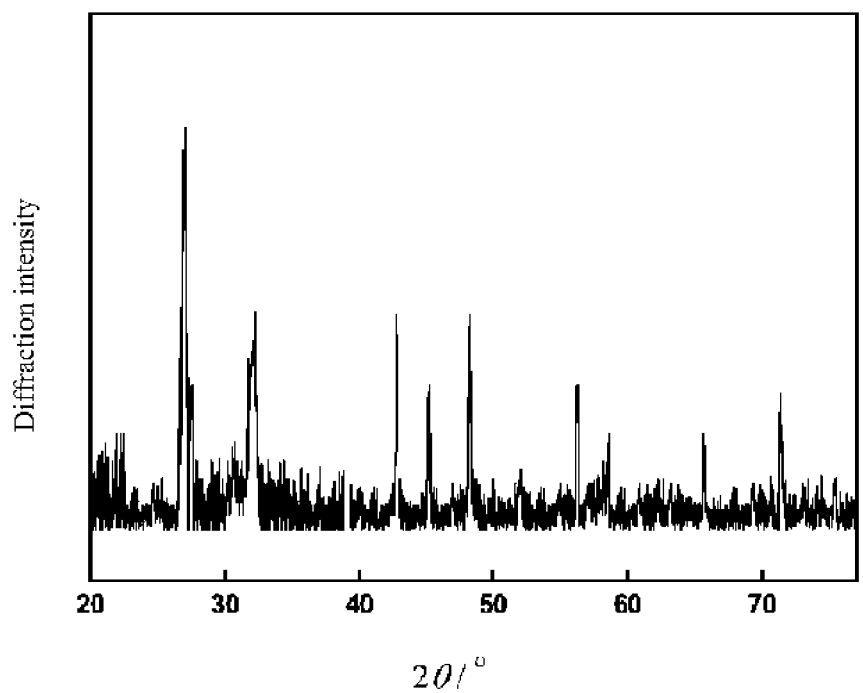
FIG. 2 shows the XRD patterns of the cerium doped magnesium barium tungstate luminescent thin film obtained from Example 1 according to the present invention.

With reference to FIG. 2, FIG. 2 shows the XRD patterns of the cerium doped magnesium barium tungstate luminescent thin film obtained from Example 1 according to the present invention, which, as compared with standard PDF card corresponds to the crystallization peaks of barium tungstate, whereas diffraction peaks are not found for the doping elements and other impurities.

EXAMPLE 2

Magnesium oxide, barium oxide, tungsten oxide and cerium oxide are mixed homogenously, wherein the content in mass percentage of MgO is 0.1%, the content in mass percentage of BaO is 40%, the content in mass percentage of $Ce_2O_3$ is 0.01%, the rest is $WO_3$ (in mass percentage);

The mixture is sintered at a temperature of 900° C. to form a ceramic sputtering target of Φ50×2 mm;

The target is loaded into a vacuum chamber, and the ITO coated glass substrate is then subjected to ultrasonic washing with a sequential use of acetone, anhydrous ethanol and deionized water, which is then subjected to oxygen plasma treatment, followed by placing it into the vacuum chamber. The distance between the target and the substrate is set to 50 mm. The chamber is evacuated by means of a mechanical pump and molecular pump such that a vacuum level $1.0\times10^{-5}$ Pa is reached, to which the vacuum chamber is purged with a mixed gas of argon and hydrogen as the operating gas, where the hydrogen content is 1% (in volume percentage), the gas flow rate is 15 sccm, the pressure is adjusted to 0.2 Pa, the substrate temperature is 600° C., a precursor of cerium doped magnesium barium tungstate luminescent thin film is formed by sputtering:

the precursor of cerium doped magnesium barium tungstate luminescent thin film is subjected to annealing in a vacuum furnace at 0.01 Pa under a temperature of 500° C. for 1 h to form the cerium doped magnesium barium tungstate luminescent thin film.

The thus obtained cerium doped magnesium barium tungstate luminescent thin film has a molecular formula of $Mg_{0.013}Ba_{0.87}W_2O_8$:0.0002 $Ce^{3+}$;

Onto the cerium doped magnesium barium tungstate luminescent thin film is then deposited a layer of Ag as a cathode, to give an electroluminescent device comprising the cerium doped magnesium barium tungstate luminescent thin film of the embodiment of the present invention.

EXAMPLE 3

Magnesium oxide, barium oxide, tungsten oxide and cerium oxide are mixed homogenously, wherein the content in mass percentage of MgO is 15%, the content in mass percentage of BaO is 0.1%, the content in mass percentage of $Ce_2O_3$ is 0.8%, the rest is $WO_3$ (in mass percentage);

The mixture is sintered at a temperature of 1300° C. to form a ceramic sputtering target of Φ50×2 min;

The target is loaded into a vacuum chamber, and the ITO coated glass substrate is then subjected to ultrasonic washing with a sequential use of acetone, anhydrous ethanol and deionized water, which is then subjected to oxygen plasma treatment, followed by placing it into the vacuum chamber. The distance between the target and the substrate is set to 100 mm. The chamber is evacuated by means of a mechanical pump and molecular pump such that a vacuum level $1.0\times10^{-3}$ Pa is reached, to which the vacuum chamber is purged with a mixed gas of argon and hydrogen as the operating gas, where the hydrogen content is 15% (in volume percentage), the gas flow rate is 30 sccm, the pressure is adjusted to 4.5 Pa, the substrate temperature is 600° C. a precursor of cerium doped magnesium barium tungstate luminescent thin film is formed by sputtering;

the precursor of cerium doped magnesium barium tungstate luminescent thin film is subjected to annealing in a vacuum furnace at 0.01 Pa under a temperature of 800 ° C. for 3 h to form the cerium doped magnesium barium tungstate luminescent thin film.

The thus obtained cerium doped magnesium barium tungstate luminescent thin film has a molecular formula of: $Mg_{0.96}Ba_{0.04}W_2O_8$: 0.0124 $Ce^{3+}$;

Onto the cerium doped magnesium barium tungstate luminescent thin film is then deposited a layer of Ag as a cathode, to give an electroluminescent device comprising the cerium doped magnesium barium tungstate luminescent thin film of the embodiment of the present invention.

EXAMPLE 4

Magnesium oxide, barium oxide, tungsten oxide and cerium oxide are mixed homogenously, wherein the content in mass percentage of MgO is 0.2%, the content in mass percentage of BaO is 30%, the content in mass percentage of $Ce_2O_3$ is 0.6%, the rest is $WO_3$ (in mass percentage);

The mixture is sintered at a temperature of 900° C. to form a ceramic sputtering target of Φ50×2 mm;

The target is loaded into a vacuum chamber, and the ITO coated glass substrate is then subjected to ultrasonic washing with a sequential use of acetone, anhydrous ethanol and deionized water, which is then subjected to oxygen plasma treatment, followed by placing it into the vacuum chamber. The distance between the target and the substrate is set to 50 mm. The chamber is evacuated by means of a mechanical pump and molecular pump such that a vacuum. level $5.0\times10^{-4}$ Pa is reached, to which the vacuum chamber is purged with a mixed gas of argon and hydrogen as the operating gas, where the hydrogen content is 8% (in volume percentage), the gas flow rate is 20 sccm, the pressure is adjusted to 0.2 Pa, the substrate temperature is 600° C., a precursor of cerium doped magnesium barium tungstate luminescent thin film is formed by sputtering;

the precursor of cerium doped magnesium barium tungstate luminescent thin film is subjected to annealing in a vacuum furnace at 0.01 Pa under a temperature of 500° C. for 2 h to form the cerium doped magnesium barium tungstate luminescent thin film.

The thus obtained cerium doped magnesium barium tungstate luminescent thin film has a molecular formula of $Mg_{0.026}Ba_{0.974}W_2O_8:0.0093Ce^{3+}$;

Onto the cerium doped magnesium barium tungstate luminescent thin film is then deposited a layer of Ag as a cathode, to give an electroluminescent device comprising the cerium doped magnesium barium tungstate luminescent thin film of the embodiment of the present invention.

EXAMPLE 5

Magnesium oxide barium oxide, tungsten oxide and cerium oxide are mixed homogenously wherein the content in mass percentage of MgO is 10%, the content in miss percentage of BaO is 0.2% the content in mass percentage of $Ce_2O_3$ is 0.4% the rest is $WO_3$ (in mass percentage);

The mixture is sintered at a temperature of 1300° C. to form a ceramic sputtering target of Φ50×2min;

The target is loaded into a vacuum chamber, and the ITO coated glass substrate is then subjected to ultrasonic washing with a sequential use of acetone, anhydrous ethanol and deionized water, which is then subjected to oxygen plasma treatment, followed by placing it into the vacuum chamber. The distance between the target and the substrate is set to 80 mm. The chamber is evacuated by means of a mechanical pump and molecular pump such that a vacuum. level $5.0 \times 10^{-4}$ Pa is reached, to which the vacuum chamber is purged with a mixed gas of argon and hydrogen as the operating gas, where the hydrogen content is 11% (in volume percentage), the gas flow rate is 23 sccm, the pressure is adjusted to 2.0 Pa., the substrate temperature is 600° C., a precursor of cerium doped magnesium barium tungstate luminescent thin film is formed by sputtering;

the precursor of cerium doped magnesium barium tungstate luminescent thin film is subjected to annealing in a vacuum furnace at 0.01 Pa under a temperature of 650° C. for 2 h to form the cerium doped magnesium barium tungstate luminescent thin film.

The thus obtained cerium doped magnesium barium tungstate luminescent thin film has a molecular formula of: $Mg_{0.995}Ba_{0.005}W_2O_8:0.0062Ce^{3+}$;

Onto the cerium doped magnesium barium tungstate luminescent thin film is then deposited a layer of Ag as a cathode, to give an electroluminescent device comprising the cerium doped magnesium barium tungstate luminescent thin film of the embodiment of the present invention.

EXAMPLE 6

Magnesium oxide, barium oxide, tungsten oxide and cerium oxide are mixed homogenously wherein the content in mass percentage of MgO is 15%, the content in mass percentage of BaO is 20%, the content in mass percentage of $Ce_2O_3$ is 0.8%, the rest is $WO_3$ (in mass percentage)

The mixture is sintered at a temperature of 1000° C. to form a ceramic sputtering target of Φ50×2 mm;

The target is loaded into a vacuum chamber, and the ITO coated glass substrate is then subjected to ultrasonic washing with a sequential use of acetone, anhydrous ethanol and deionized water, which is then subjected to oxygen plasma treatment, followed by placing it into the vacuum chamber. The distance between the target and the substrate is set to 95 mm. The chamber is evacuated by means of a mechanical pump and molecular pump such that a vacuum. level $5.0 \times 10^{-4}$ Pa is reached, to which the vacuum chamber is purged with a mixed gas of argon and hydrogen as the operating gas, where the hydrogen content is 9% (in volume percentage), the gas flow rate is 20 sccm, the pressure is adjusted to 2.0 Pa the substrate temperature is 600° C., a precursor of cerium doped magnesium barium tungstate luminescent thin film is formed by sputtering;

the precursor of cerium doped magnesium barium tungstate luminescent thin film is subjected to annealing in a vacuum furnace at 0.01 Pa under a temperature of 750° C. for 2.5 h to form the cerium doped magnesium barium tungstate luminescent thin flint The thus obtained cerium doped magnesium barium tungstate luminescent thin film has a molecular formula of $Mg_{0.74}Ba_{0.26}W_2O_8:0.0124Ce^{3+}$;

Onto the cerium doped magnesium barium tungstate luminescent thin film is then deposited a layer of Ag as a cathode, to give an electroluminescent device comprising the cerium doped magnesium barium tungstate luminescent thin film of the embodiment of the present invention.

Although the present invention has been described and illustrated in detail, it is clearly understood that the same is by way of illustrating the preferred embodiment of the present invention and is not to be taken by way of limitation, it should be understood that various changes, substitutions, and alterations could be made hereto without departing from the spirit and scope of the invention.

What is claimed is:

1. A cerium doped magnesium barium tungstate luminescent thin film, wherein said cerium doped magnesium barium tungstate luminescent thin film has the molecular formula of $Mg_xBa_{1-x}W_2O_8$: $yCe^{3+}$, where x is from range of 0.13 to 0.96, y is from range of 0.0002 to 0.0124.

2. The cerium doped magnesium barium tungstate luminescent thin film according to claim 1, wherein x is 0.43, y is 0.0023.

3. A method of manufacturing a cerium doped magnesium barium tungstate luminescent thin film wherein said method comprises the steps of:
   mixing magnesium oxide, barium oxide, tungsten trioxide and cerium oxide to obtain a mixture;
   forming the mixture into a target body;
   sintering the target body for forming sputtering target, wherein the content in mass percentage of said magnesium oxide is 0.1% to 15%, the content in mass percentage of said barium oxide is 0.1% to 40%, the content in mass percentage of said cerium oxide is 0.01% to 0.8%, the rest is tungsten trioxide;
   providing a substrate upon which a cerium doped magnesium barium tungstate luminescent thin film is formed;
   forming the precursor of cerium doped magnesium barium tungstate luminescent thin film by magnetron sputtering; and
   annealing the precursor of cerium doped magnesium barium tungstate luminescent thin film to obtain the cerium doped magnesium barium tungstate luminescent thin film.

4. The method of manufacturing a cerium doped magnesium barium tungstate luminescent thin film according to claim 3, wherein the content in mass percentage of said magnesium oxide is 0.2% to 10%, the content in mass percentage of said barium oxide is 0.2% to 30%, the content in mass percentage of said cerium oxide is 0.02% to 0.6%, the rest is tungsten trioxide.

5. The method of manufacturing a cerium doped magnesium barium tungstate luminescent thin film according to claim 3, wherein the content in mass percentage of said magnesium oxide is 6%, the content in mass percentage of said barium oxide is 30%, the content in mass percentage of said cerium oxide is 0.15%, the rest is tungsten trioxide.

6. The method of manufacturing a cerium doped magnesium barium tungstate luminescent thin film according to claim 3, wherein said sintering is conducted at a temperature of 900° C. to 1300° C.

7. The method of manufacturing a cerium doped magnesium barium tungstate luminescent thin film according to claim 3, wherein said sputtering is conducted under the following conditions: the distance between the substrate and the target is 50 to 100 mm, the substrate temperature is 250° C. to 750° C., employing a mixed gas of hydrogen and an inert gas as the operating gas, gas flow rate is 15 to 30sccm, pressure is 0.2 to 4.5Pa.

8. The method of manufacturing a cerium doped magnesium barium tungstate luminescent thin film according to claim 7, wherein the content in volume percentage of hydrogen in said mixed gas is 1% to 15%.

9. The method of manufacturing a cerium doped magnesium barium tungstate luminescent thin film according to claim 3, wherein said annealing is conducted at a temperature of 500° C. to 800° C. for a time period of 1 to 3 h.

10. An electroluminescent device, comprising a cerium doped magnesium barium tungstate luminescent thin film according to claim 1.

* * * * *